United States Patent
Hu et al.

(10) Patent No.: US 7,994,632 B2
(45) Date of Patent: Aug. 9, 2011

(54) INTERDIGITATED CONDUCTIVE LEAD FRAME OR LAMINATE LEAD FRAME FOR GAN DIE

(75) Inventors: Kunzhong Hu, Santa Monica, CA (US); Chuan Cheah, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 74 days.

(21) Appl. No.: 11/650,152

(22) Filed: Jan. 5, 2007

(65) Prior Publication Data

US 2007/0181934 A1 Aug. 9, 2007

Related U.S. Application Data

(60) Provisional application No. 60/757,797, filed on Jan. 10, 2006.

(51) Int. Cl.
*H01L 23/48* (2006.01)
(52) U.S. Cl. ............... 257/692; 257/690; 257/E23.079; 257/691
(58) Field of Classification Search ........... 257/48, 257/666, 672, 673, 690, 691, 692, 693, 696, 257/E23.079
See application file for complete search history.

(56) References Cited

U.S. PATENT DOCUMENTS

| | | | |
|---|---|---|---|
| 5,473,512 A | 12/1995 | Degani et al. | |
| 5,856,687 A * | 1/1999 | Kimura | 257/235 |
| 5,915,164 A * | 6/1999 | Taskar et al. | 438/47 |
| 5,945,730 A * | 8/1999 | Sicard et al. | 257/666 |
| 6,278,264 B1 | 8/2001 | Bursetin et al. | |
| 6,740,969 B1 | 5/2004 | Hirashima | |
| 6,906,410 B2 * | 6/2005 | Aono et al. | 257/691 |
| 7,295,453 B2 * | 11/2007 | Shiraishi et al. | 363/144 |
| 2004/0200886 A1 | 10/2004 | Cheah | |
| 2005/0139891 A1 | 6/2005 | Beach et al. | |

* cited by examiner

*Primary Examiner* — Lex Malsawma
*Assistant Examiner* — Robert Huber
(74) *Attorney, Agent, or Firm* — Farjami & Farjami LLP

(57) ABSTRACT

A GaN die having a plurality of parallel alternating and closely spaced source and drain strips is contacted by parallel coplanar comb-shaped fingers of source and drain pads. A plurality of enlarged area coplanar spaced gate pads having respective fingers contacting the gate contact of the die. The pads may be elements of a lead frame, or conductive areas on an insulation substrate. Other semiconductor die can be mounted on the pads and connected in predetermined circuit arrangements with the GaN die.

17 Claims, 3 Drawing Sheets

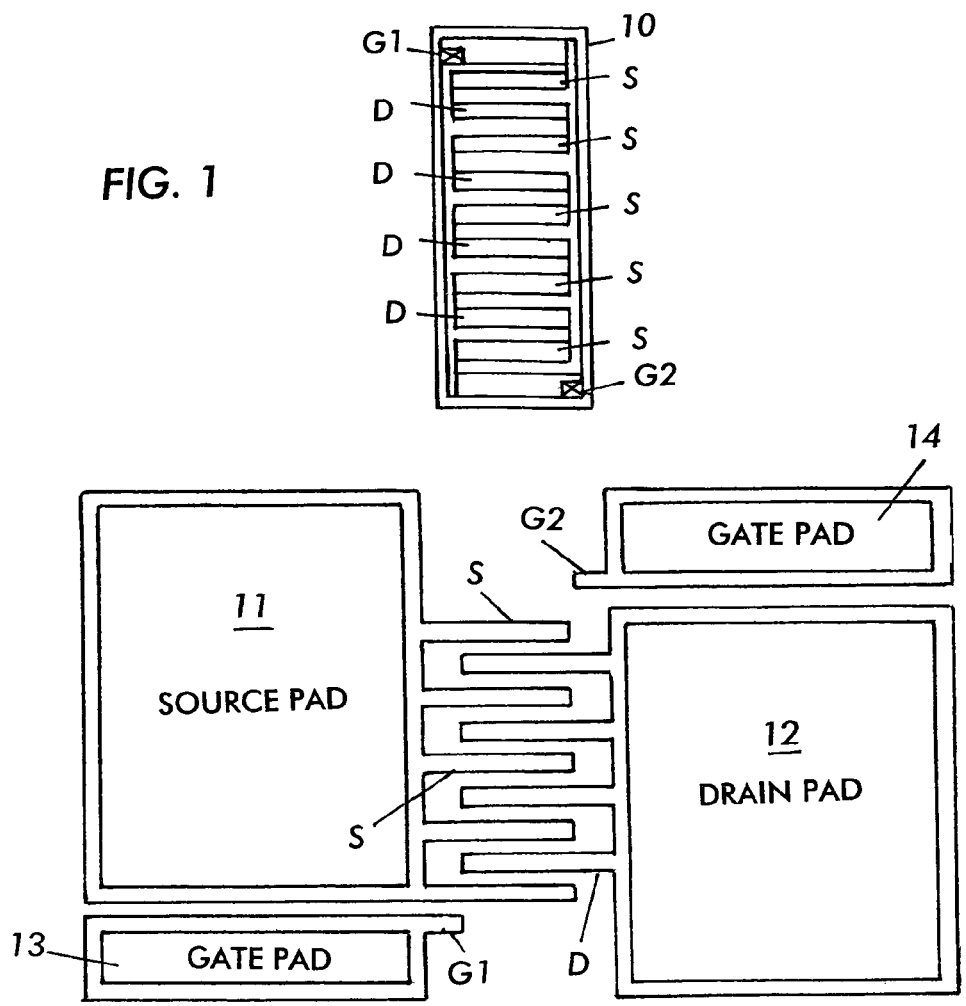
FIG. 1
FIG. 2a
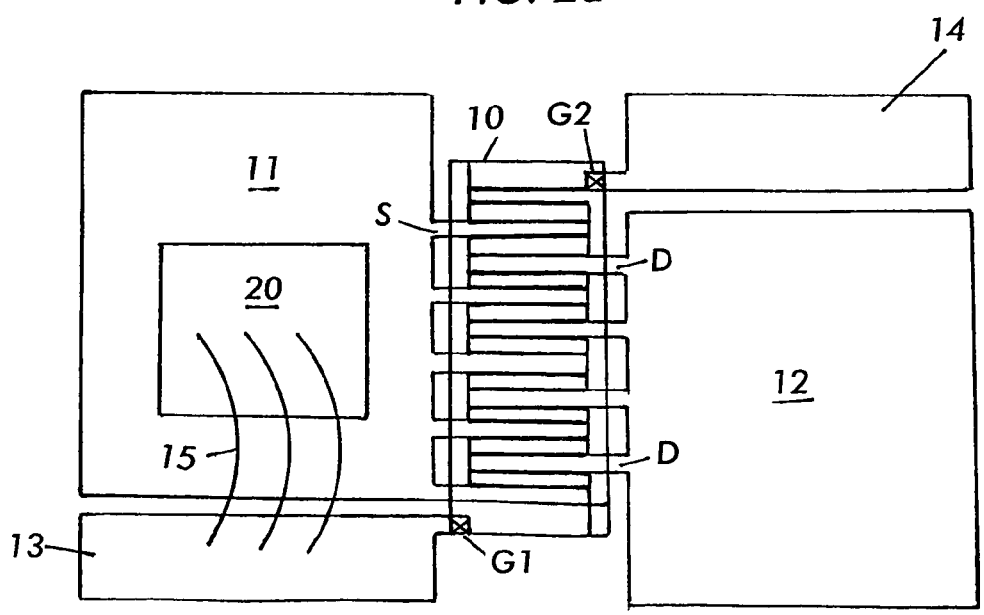
FIG. 2b

INTERDIGITATED CONDUCTIVE LEAD FRAME OR LAMINATE LEAD FRAME FOR GAN DIE

RELATED APPLICATIONS

This application claims the benefit of U.S. Provisional Application No. 60/757,797, filed Jan. 10, 2006, the entire disclosure of which is incorporated by reference herein.

FIELD OF THE INVENTION

This invention relates to a novel conductive support structure for GaN die and assemblies of GaN die with other die connected thereto.

BACKGROUND OF THE INVENTION

It is necessary to provide a conductive support for the packaging of GaN die (III-Nitride heterojunction die) and for other semiconductor die connected in various circuit configurations with the GaN die. Thus, coplanar conductive lead frames or laminates with conductive pad surfaces are conventionally used to support semiconductor die. The connection to GaN die, which are commonly bidirectional lateral conduction die, is complicated by the electrode pattern of the GaN die which commonly is a pattern of alternating thin closely spaced drain and source pads in a ladder-like configuration.

It would be desirable to provide a conductive support which would provide connectors to the closely spaced source and drain strips of a GaN die and to provide an effective heat sink for these electrodes and to provide a mounting area for other die such as silicon-based diodes and MOSFETs to be connected in various circuit arrangements with the GaN die.

SUMMARY OF THE INVENTION

In accordance with the invention, a conductive support for GaN die is provided with enlarged area conductor surfaces having spaced parallel sides with laterally projecting and coplanar spaced interdigitated fingers which align with and receive respective ones of the source and drain strips of a lateral conduction GaN based die thus forming an enlarged contact surface for wire bond or other connection to the GaN device source and drain electrodes. By "enlarged area" is meant an area equal to or greater than the area of the top surface of the die. At least two further enlarged gate areas are disposed adjacent edges of one or both of the source and drain connection area and are provided with respective coplanar projecting fingers to align with and contact the gate electrodes of the GaN die. Other die, for example, silicon based diodes and vertical conduction MOSFETs or other MOS gated devices may also be surface mounted on one or both of the enlarged source and drain pads and wire bonded in any desired circuit configuration with the GaN die.

BRIEF DESCRIPTION OF THE DRAWINGS

FIG. 1 is a top plan view of a GaN die having laterally disposed and alternating drain electrode strips and end gate electrodes.

FIG. 2a shows a lead frame constructed in accordance with the invention for receiving the die of FIG. 1.

FIG. 2b schematically shows the die of FIG. 1 mounted on the interdigitated fingers of the lead frame of FIG. 2a.

FIG. 3b shows the die of FIG. 1 on the interdigitated fingers of the lead frame of FIG. 3a.

FIG. 4b shows the die of FIG. 1 on the interdigitated fingers of the lead frame of FIG. 4a.

DESCRIPTION OF THE PREFERRED EMBODIMENTS

Figure 3A:
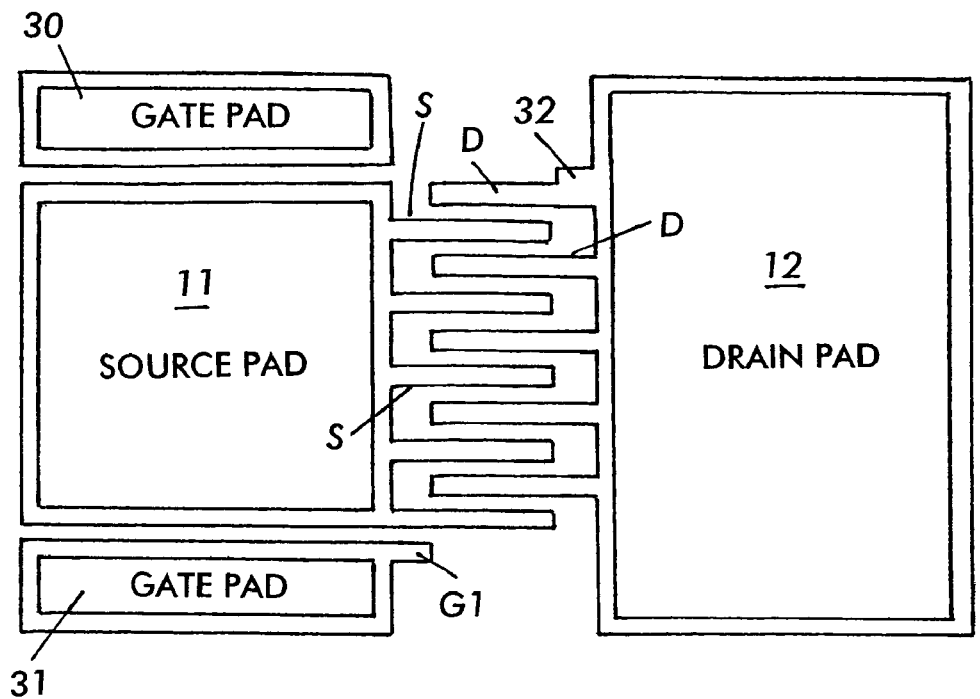
FIG. 3a shows a second embodiment of the lead frame of FIG. 2a with a modified gate pad arrangement.

FIG. 1 is a top view of a bidirectional conduction GaN die 10 having alternately spaced source electrodes S and drain electrodes D and gate electrodes G1 and G2. Such die are shown in detail in U.S. Patent Publication No. 2005/0139891 filed Dec. 3, 2004 entitled III-NITRIDE DEVICE WITH IMPROVED LAYOUT GEOMETRY in the names of Beach and Bridger (IR-2616) and in U.S. Patent Publication No. 2006/0131760 filed Sep. 13, 2005 entitled POWER SEMI-CONDUCTOR PACKAGE in the names of Standing and Clark (IR-2742), which are incorporated entirely herein by reference.

FIG. 2a is a top view of a conductive lead frame which has been patterned and stamped in accordance with the invention to receive the die of FIG. 1. Thus, the lead frame has an enlarged source pad 11 and an enlarged drain pad 12 which each have sets of comb-like extending fingers S and D respectively which correspond to the locations and width of the electrodes S and D respectively on die 10. All of Fingers S and D are in a common plane. Two gate pads 13 and 14 are also provided as shown; having respective extending lead frame fingers G1 and G2 for connection to electrodes G1 and G2 of die 10. Lead frame fingers G1 and G2 are also coplanar with fingers S and D.

FIG. 2b shows the die 10 laid over the various drain, source and gate fingers of the lead frame, and connected thereto as by soldering or by other conductive adhesives, or the like. The enlarged source and drain pads 11 and 12 respectively will act as excellent heat sinks for die 10.

The source and drain pads 11 and 12 can also receive diverse die or other components to be connected in circuit relation with die 10. Thus, in FIG. 2b, a diode die 20 has one electrode conductively secured or bonded to the source pad 11 and its upper surface wire bonded to the lower gate pad 12 by wire bonds 15.

A plastic housing, not shown, can enclose die 10 and the lead frame, with portions of the lead frame extending through the housing for external circuit connection.

Figure 3B:
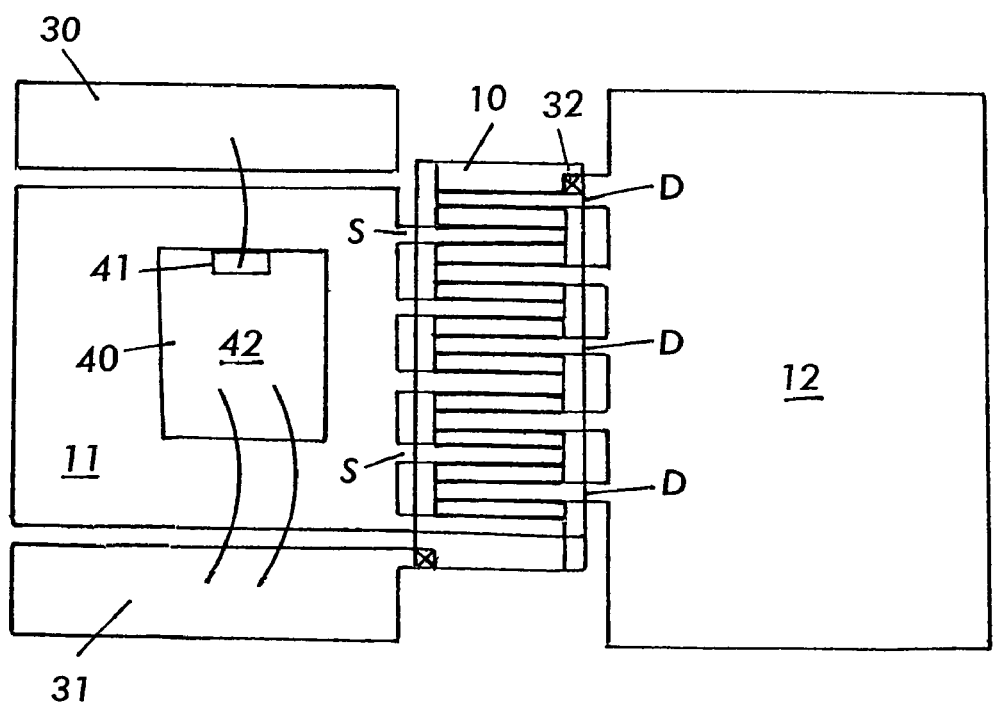

FIGS. 3a and 3b show a second embodiment of the invention.

The lead frame of FIG. 3a is modified from that of FIG. 2a to have gate pads 30 and 31 on opposite sides of the source pad 11. A projection 32 extends from the drain pad in FIG. 3a for connection to gate G2 of die 10.

The GaN device 10 is assembled to the lead frame of FIG. 3a in FIG. 3b. A vertical conduction silicon based MOSFET 40 has its bottom drain electrode secured to and connected to the source pad 11 in FIG. 3a, and its gate and source electrodes 41 and 42 respectively are wire bonded to gate pads 30 and 31 respectively as shown.

Figure 4A:
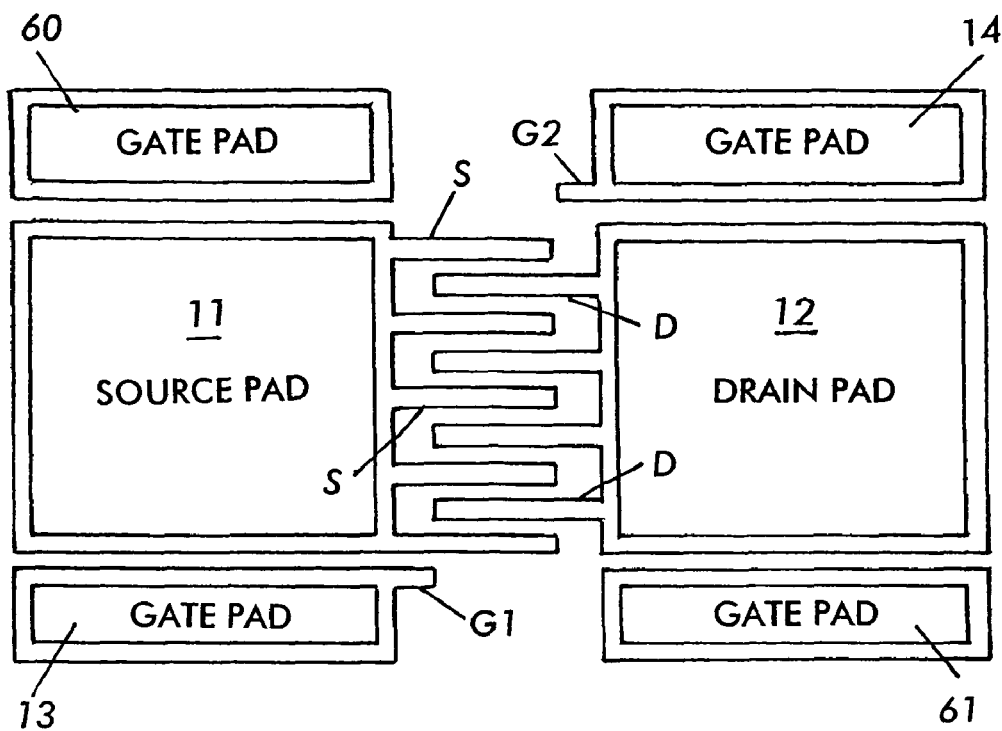
FIG. 4a shows a third embodiment of the invention with a further modified gate pad arrangement.
Figure 4B:
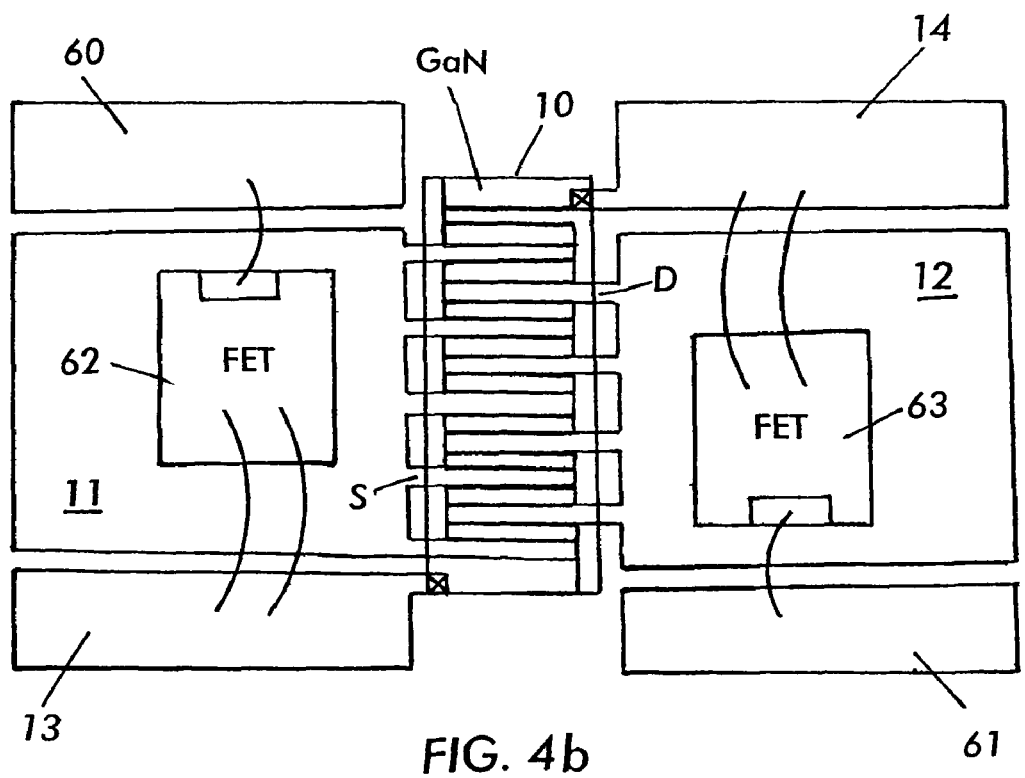

FIGS. 4a and 4b show a further embodiment of the invention. The lead frame of FIG. 4a is like that of FIG. 2a but two additional gate pads 60 and 61 are added above the source pad 11 and below the drain pad 12 respectively. Vertical conduction MOSFET die 62 and 63 then have their drain electrodes bonded to the source and drain pads 11 and 12 respectively.

The source electrodes and gate electrodes of MOSFETs 62 and 63 are then wire bonded as shown to form a circuit with die 10.

The lead frames in FIG. 2a, 3a and 4a can be replaced by any other desired conductive substrate such as a laminated substrate with plural layers containing other circuit components, or an IMS substrate or the like.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A conductive support for a lateral conduction GaN semiconductor die having a plurality of parallel spaced and interleaved source and drain electrode strips on a surface of said die;
    said conductive support having an enlarged source pad, a coplanar, spaced enlarged drain pad and at least one coplanar, spaced enlarged gate pad, wherein said enlarged source pad and said enlarged drain pad act as heatsinks;
    the facing edges of said source and drain pads each having a plurality of integral extending spaced parallel fingers;
    said fingers of said source and drain pads being interdigitated and parallel to one another and spaced from one another;
    the alternate source and drain fingers being disposed in alignment with and in contact with respective ones of said source and drain electrode strips;
    wherein said at least one coplanar, spaced enlarged gate pad is not interdigitated.

2. The conductive support of claim 1, said GaN die having at least one gate electrode at one edge region of said die; said at least one gate pad having an edge in alignment with said edge of said source pad; and a gate contact finger extending from said at least one gate pad edge and in alignment with and in contact with said gate electrode.

3. The support of claim 1, wherein said source and drain pads are components of a thin conductive lead frame.

4. The support of claim 2, wherein said source, drain and gate pads are components of a thin conductive lead frame.

5. The support of claim 1, wherein said source and drain pads are supported on an insulation support surface.

6. The support of claim 2, wherein said source, drain and gate pads are supported on an insulation support surface.

7. The support of claim 4, which further includes a second semiconductor die having top and bottom electrodes; said bottom electrode of said die being conductively fixed to the surface of one of said source or drain pads, the top electrode of said die being connected to another of said pads.

8. The support of claim 6, which further includes a second semiconductor die having top and bottom electrodes; said bottom electrode of said die being conductively fixed to the surface of one of said source or drain pads, the top electrode of said die being connected to another of said pads.

9. The support of claim 2, which further includes a second gate electrode at the opposite edge region from said one edge region of said GaN die and a second gate pad spaced from and coplanar with said drain pad and having an edge in alignment with said edge of said drain pad; and a second gate contact finger extending from said edge of said second gate pad and in alignment with and in contact with said second gate electrode.

10. The support of claim 9, wherein said source, drain and gate pads are components of a thin conductive lead frame.

11. The support of claim 9, wherein said source, drain and gate pads are supported on an insulation support surface.

12. The support of claim 9, which further includes a second semiconductor die having top and bottom electrodes; said bottom electrode of said die being conductively fixed to the surface of one of said source or drain pads, the top electrode of said die being connected to another of said pads.

13. A semiconductor device comprising a lateral conduction GaN die and a conductive support therefore which provides improved contact to the electrodes of said GaN die;
    said GaN die having an elongated rectangular shape;
    one surface of said die comprising a ladder of parallel coplanar contact strips which are, alternately, source and drain electrode strips, and at least one gate strip at one end of said ladder;
    said conductive support comprising an enlarged area source pad, an enlarged area drain pad and an enlarged area gate pad; all of said pads being spaced from one another, wherein said enlarged source pad and said enlarged drain pad act as heatsinks;
    one edge of each of said source and drain pads having combs of parallel spaced contact fingers;
    said contact fingers of said source and drain pads being interdigitated and coplanar and disposed over and in contact with respective ones of said source and drain contact strips;
    said gate pad having a gate contact finger spaced from and coplanar with said contact fingers and extending therefrom and in contact with said gate strip on said die;
    wherein said enlarged area gate pad is not interdigitated.

14. The device of claim 13, wherein said source, drain and gate contacts are connected to their respective contact strips by solder or a conductive adhesive.

15. The device of claim 14, which further includes a second semiconductor die having top and bottom electrodes;
    said bottom electrode of said die being conductively fixed to the surface of one of said source or drain pads, the top electrode of said die being connected to another of said pads.

16. The support of claim 1 further comprising a vertical conduction second semiconductor die having top and bottom electrodes;
    said bottom electrode of said semiconductor die being conductively fixed to the surface of one of said source or drain pads, and the top electrode of said second semiconductor die being connected to said at least one gate pad, wherein said second semiconductor die is a silicon based diode or a silicon based MOSgated device.

17. The device of claim 14 further comprising a second vertical conduction silicon based semiconductor die having top and bottom electrodes;
    said bottom electrode of said die being conductively fixed to the surface of one of said source or drain pads, and the top electrode of said second semiconductor die being connected to another pad.

* * * * *